United States Patent
Li et al.

(10) Patent No.: US 10,243,174 B2
(45) Date of Patent: Mar. 26, 2019

(54) OLED PACKAGING STRUCTURE AND MANUFACTURING METHOD THEREOF AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Rui Li, Beijing (CN); Xianxue Duan, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/217,196

(22) Filed: Jul. 22, 2016

(65) Prior Publication Data
US 2017/0194595 A1    Jul. 6, 2017

(30) Foreign Application Priority Data
Jan. 4, 2016    (CN) .......................... 2016 1 0003612

(51) Int. Cl.
*H01L 51/52* (2006.01)
*H01L 51/56* (2006.01)
*H01L 51/00* (2006.01)

(52) U.S. Cl.
CPC ........ *H01L 51/529* (2013.01); *H01L 51/0003* (2013.01); *H01L 51/5246* (2013.01); *H01L 51/56* (2013.01)

(58) Field of Classification Search
CPC ... H01L 51/529; H01L 51/56; H01L 51/5246; H01L 51/0003; H01L 51/00;
(Continued)

(56) References Cited

U.S. PATENT DOCUMENTS

| 7,135,357 | B2 * | 11/2006 | Yu ......................... H01L 51/529 257/E23.104 |
| 2005/0023970 | A1 * | 2/2005 | Maeda ................ H01L 27/3288 313/506 |
| 2008/0054795 | A1 * | 3/2008 | Ohmi .................. H01L 51/5206 313/504 |
| 2009/0115321 | A1 * | 5/2009 | Hayashi .............. H01L 51/5253 313/504 |
| 2014/0159017 | A1 | 6/2014 | Ikeda et al. |

(Continued)

FOREIGN PATENT DOCUMENTS

| CN | 1578570 A | 2/2005 |
| CN | 102379155 A | 3/2012 |

(Continued)

OTHER PUBLICATIONS

Second Office Action regarding Chinese Application No. 201610003612.5, dated Apr. 12, 2017. Translation provided by Dragon Intellectual Property Law Firm.

(Continued)

*Primary Examiner* — Thanh T Nguyen
(74) *Attorney, Agent, or Firm* — Harness, Dickey & Pierce, P.L.C.

(57) ABSTRACT

The present disclosure provides an OLED packaging structure and a manufacturing method thereof, and a display device comprising the packaging structure. The OLED packaging structure comprises a first substrate, an OLED disposed on the surface of the first substrate, and a packaging layer covering the OLED, wherein the packaging layer comprises a heat dissipation layer.

19 Claims, 3 Drawing Sheets

(58) Field of Classification Search
CPC ....... H01L 2924/12044; H01L 27/3209; H01L 51/5287; H01L 2227/32; H01L 2251/56; H01L 2251/566; H01L 27/3251; H01L 27/3225; H01L 27/3258; H01L 51/525; H01L 2227/326; H01L 27/32; H01L 51/52; H01L 51/5253
See application file for complete search history.

(56) References Cited

U.S. PATENT DOCUMENTS

| | | |
|---|---|---|
| 2014/0374726 A1 | 12/2014 | Goeoetz et al. |
| 2015/0123095 A1 | 5/2015 | Washio |
| 2015/0179611 A1* | 6/2015 | Lu ..................... H01L 23/49811 257/659 |
| 2017/0062383 A1* | 3/2017 | Yee ..................... H01L 25/0652 |

FOREIGN PATENT DOCUMENTS

| | | |
|---|---|---|
| CN | 102726121 A | 10/2012 |
| CN | 103367623 A | 10/2013 |
| CN | 104054191 A | 9/2014 |
| JP | 2003007450 A | 1/2003 |

OTHER PUBLICATIONS

First Office Action regarding Chinese Application No. 201610003612.5, dated Dec. 16, 2016. Translation provided by Dragon Intellectual Property Law Firm.

Third Office Action regarding Chinese Application No. 201610003612.5, dated Jun. 13, 2017. Translation provided by Dragon Intellectual Property Law Firm.

* cited by examiner

OLED PACKAGING STRUCTURE AND MANUFACTURING METHOD THEREOF AND DISPLAY DEVICE

CROSS-REFERENCE TO RELATED APPLICATION

This application claims a priority to Chinese Patent Application No. 201610003612.5 filed on Jan. 4, 2016 in China, the disclosures of which are incorporated in their entirety by reference herein.

TECHNICAL FIELD

The present disclosure relates to the field of packaging technology, in particular to an OLED packaging structure and a manufacturing method thereof and a display device.

BACKGROUND

An OLED (Organic Light-Emitting Diode) display apparatus comprises a substrate, an OLED, a packaging layer and a packaging coverplate, and the OLED comprises an anode, an organic layer (including a hole transport layer and an electron transport layer, and an organic light-emitting layer located between the hole transport layer and the electron transport layer) and a cathode. As compared with the LCD display apparatus, the OLED display apparatus has the following advantages: thin display panel, light weight, wide viewing angle, active light emission, continuous and adjustable color of emitted light, low cost, fast response, low energy consumption, low driving voltage, a wide range of operating temperatures, simple production process, high light-emitting efficiency, and ability to realize flexible display. The OLED attracts much attention from industrial and scientific fields due to its advantages that other displays could not match and good application prospect.

Studies have shown that water vapor, oxygen and the like in the air have great impact on the service life of the OLED for the following main reasons: (1) when the OLED works, electrons are to be injected into the cathode, which requires the work function of the cathode to be lower, but metallic materials, such as aluminum, magnesium, calcium, etc, which are common materials of the cathode, are usually active and apt to react with water vapor permeating into the OLED; (2) the water vapor will also react with the hole transport layer and the electron transport layer, which will cause failure of the OLED. Therefore, it is necessary to effectively package the OLED to isolate functional layers of the device from the water vapor, oxygen and the like in the air, whereby the service life of the device can be prolonged.

At present, a relatively effective method of packaging the OLED is to manufacture a single thin film or multiple thin films on the substrate and the functional layers so as to prevent the permeation of water, oxygen and other ingredients. A traditional water vapor barrier layer is a packaging layer formed by the combination of an inorganic layer and an organic layer. The inorganic layer could better prevent the permeation of water and oxygen, but there are some shortcomings in its manufacturing process, it has low elasticity and relatively large internal stress and is easy to peel off from the OLED. Therefore, it is required to combine the inorganic layer and the organic layer for packaging. Although the organic layer does not do well in isolating water and oxygen, the organic material itself exhibits certain water absorbency as well as relatively good bonding effect, and thus can ensure that the OLED and the inorganic layer are well bonded. However, since such multilayer structure comprises multiple layers having different refractive indexes, when light passes through the layers directly, total internal reflection will occur at interfaces between the layers, which will reduce the output of light. Furthermore, this part of light will be converted into heat to damage the OLED.

SUMMARY

The present disclosure provides an OLED packaging structure and a manufacturing method thereof, and a display device comprising the packaging structure, and solves the problem that, when a packaging layer is used to isolate water and oxygen from the OLED, light lost due to the total internal reflection caused by different refractive indexes between the layers of the packaging structure will be converted into heat to damage the OLED.

In order to solve the above technical problem, the present disclosure provides technical solutions as follows.

According to one aspect of the present disclosure, an OLED packaging structure is provided, which comprises a first substrate, an OLED disposed on the surface of the first substrate and a packaging layer covering the OLED, wherein the packaging layer comprises a heat dissipation layer.

According to an embodiment of the present disclosure, a first surface of the heat dissipation layer away from the OLED is uneven.

According to another embodiment of the present disclosure, the packaging layer further comprises an organic layer in contact with the OLED, and an inorganic layer, the inorganic layer and the heat dissipation layer being located at a side of the organic layer away from the OLED.

According to another embodiment of the present disclosure, a first surface of the organic layer away from the OLED is uneven.

According to another embodiment of the present disclosure, the heat dissipation layer is arranged to be in contact with the first surface of the organic layer.

According to another embodiment of the present disclosure, the packaging structure further comprises a sealant layer covering the packaging layer.

According to another embodiment of the present disclosure, the material of the heat dissipation layer is transparent graphene.

According to another aspect of the present disclosure, a display device comprising the OLED packaging structure as described above is provided.

According to a further aspect of the present disclosure, a method of manufacturing the OLED packaging structure as describe above is provided, which comprises steps of forming the OLED and forming the packaging layer covering the OLED, wherein the step of forming the packaging layer comprises a step of forming the heat dissipation layer.

According to another embodiment of the present disclosure, the step of forming the heat dissipation layer comprises: forming a first thin film; and forming an uneven structure on a surface of the first thin film away from the OLED so as to form the heat dissipation layer.

According to another embodiment of the present disclosure, the step of forming the packaging layer further comprises: steps of forming an organic layer in contact with the OLED and forming an inorganic layer, the inorganic layer and the heat dissipation layer being located at a side of the organic layer away from the OLED.

According to another embodiment of the present disclosure, the step of forming the organic layer comprises:

forming a second thin film; and forming an uneven structure on a surface of the second thin film away from the OLED so as to form the organic layer.

According to another embodiment of the present disclosure, the heat dissipation layer is formed on a first surface of the organic layer away from the OLED.

According to another embodiment of the present disclosure, the manufacturing method further comprises forming a sealant layer covering the packaging layer.

According to another embodiment of the present disclosure, the sealant layer is made of a heat-curable material or a UV-curable material.

According to another embodiment of the present disclosure, the heat dissipation layer is made of graphene.

According to another embodiment of the present disclosure, the first thin film of the heat dissipation layer is formed by an inkjet printing, a chemical vapor deposition or a mechanical exfoliation process.

According to another embodiment of the present disclosure, the organic layer is made of polyacrylates.

According to another embodiment of the present disclosure, the second thin film of the organic layer is formed by sputtering, evaporation or spin coating.

The above-mentioned technical solutions of the present disclosure produce the following advantageous effects: in the above-mentioned technical solutions, the packaging layer for packaging the OLED comprises the heat dissipation layer which is used to dissipate heat for the OLED so as to prevent the generation of excessively high temperature and the damage to the OLED caused thereby.

BRIEF DESCRIPTION OF THE DRAWINGS

In order to explain technical solutions of the embodiments of the present disclosure more clearly, accompanying drawings which are required to be used in the embodiments will be briefly introduced below. Obviously, the drawings described below show merely some embodiments of the present disclosure, and other drawings can be obtained by a person having ordinary skills in the art according to these drawings without exercising any inventive skill.

DETAILED DESCRIPTION

Below, the present disclosure will be further described in detail in conjunction with the drawings and embodiments. The following embodiments are for illustrative purpose only, and are not intended to limit the protection scope of the present disclosure.

Figure 1:
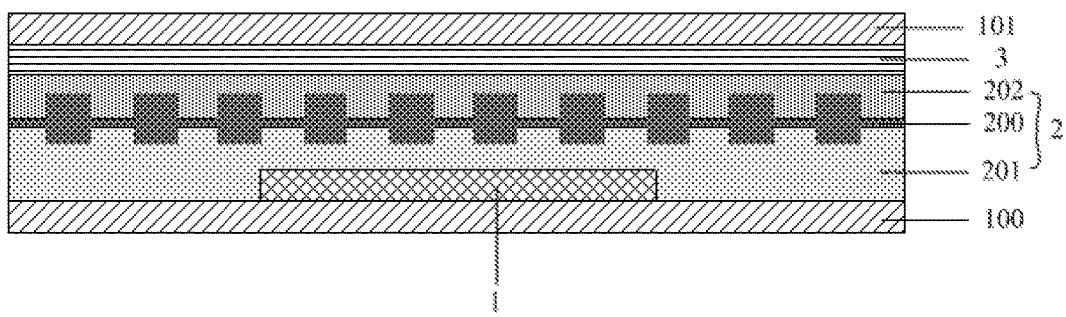
FIG. 1 is a schematic diagram 1 of an OLED packaging structure of an embodiment of the present disclosure.
Figure 2:
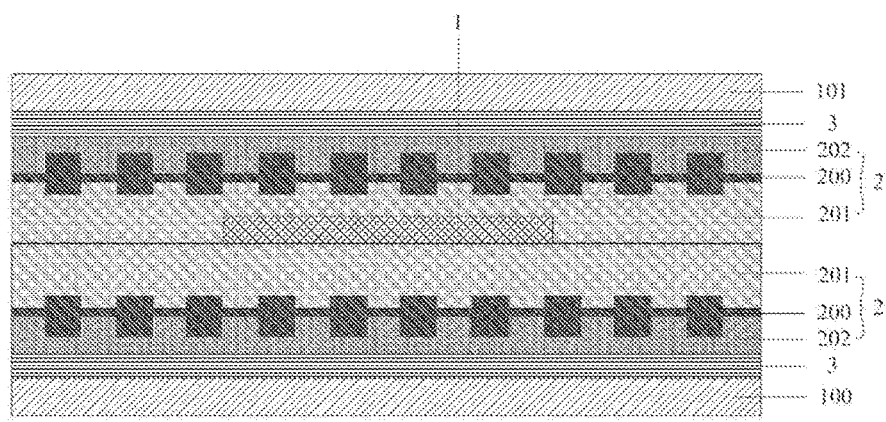
FIG. 2 is a schematic diagram 2 of an OLED packaging structure of an embodiment of the present disclosure.

As shown in FIGS. 1 and 2, the embodiment of the present disclosure provides an OLED packaging structure comprising a first substrate 100, an OLED 1 disposed on the surface of the first substrate 100, and a packaging layer 2 covering the OLED 1. The packaging layer 2 comprises a heat dissipation layer 200 which is used to dissipate heat for the OLED 1 so as to prevent the generation of excessively high temperature and the damage to the OLED caused thereby.

The heat dissipation layer 200 preferably adopts a transparent heat dissipation material, such as graphene, so as to reduce the impact of the packaging layer 2 on light transmittance.

The packaging layer 2 further comprises an organic layer 201 in contact with the OLED 1, and an inorganic layer 202. The heat dissipation layer 200 and the inorganic layer 202 are located at a side of the organic layer 201 away from the OLED 1. The organic layer 201 is used to strengthen the bonding between the heat dissipation layer 200 and the inorganic layer 202 and the OLED 1. The inorganic layer 202 is used to prevent permeation of water, oxygen, etc in the environment into the OLED 1 and thus prevent the influence of the permeation on the service life of the OLED. Since the organic layer 201 and the inorganic layer 202 are made of different materials and have different refractive index, total internal reflection will occur at an interface therebetween, which will reduce the effectiveness of transmission of light through the packaging layer 2. This part of energy will be converted into heat to be dissipated through the heat dissipation layer 200, which can prevent the generation of excessively high temperature and the damage to the OLED caused thereby.

It shall be noted that, respective layers of the packaging layer 2 are arranged in a stacking manner. In the present disclosure, "the packaging layer 2 covering the OLED 1" comprises two situations, one of which is that the packaging layer 2 is formed on the surface of the OLED 1 after the latter has formed on the surface of the first substrate 100, and the other of which is that the OLED 1 is formed on the surface of the packaging layer 2 after the latter has formed on the surface of the first substrate 100.

In the embodiment of the present disclosure, the packaging layer 2 may cover only one surface of the OLED 1 away from the first substrate 100 as shown in FIG. 1, or may cover both surfaces of the OLED 1, one of which is away from the first substrate 100 and the other of which close to the first substrate 100, as shown in FIG. 2. Either of these two structures aims to better prevent the permeation of water, oxygen, etc in the environment into the OLED 1 and thus prevent the damage to the OLED 1 ultimately.

Optionally, a first surface of the heat dissipation layer 200 away from the OLED 1 is uneven so as to increase the surface area and thereby improve the effect of heat dissipation.

The heat dissipation layer 200 and the inorganic layer 202 and the OLED 1 are not well bonded, while the organic layer 201 is well bonded with the OLED 1. Therefore, in order to improve the bonding effect of the heat dissipation layer 200 and the inorganic layer 202 and the OLED 1, the organic layer 201 may be arranged to be in contact with the OLED 1 and have an uneven first surface away from the OLED 1. Due to such an arrangement, the contact area between the heat dissipation layer 200 or the inorganic layer 202 and the organic layer 201 is increased, and thus the bonding effect is improved. Further, the heat dissipation layer 200 is arranged to be in contact with the first surface of the organic layer 201 so as to increase the surface area of the heat dissipation layer 200 and thereby improve the effect of heat dissipation.

In the embodiment of the present disclosure, by arranging the heat dissipation layer 200 to have an uneven first surface away from the OLED 1 and in contact with the uneven first surface of the organic layer 201 away from the OLED1, the surface areas of the two surfaces of the heat dissipation layer 200 can be increased, and the effect of heat dissipation can be further improved.

In order to improve the packaging effect, the OLED packaging structure is arranged to further comprise a sealant layer 3 covering the packaging layer 2. The sealant layer 3 may be made of a heat-curable material or a UV-curable material, and further prevents the permeation of water, oxygen and the like in the environment into the OLED 1.

The OLED 1 may be a top-emitting OLED, or a bottom-emitting OLED.

The OLED packaging structure further comprises a packaging coverplate 101 which is a transparent substrate and which is packaged with the first substrate 100 to form a cell.

As shown in FIG. 1, the OLED packaging structure of the embodiment of the present disclosure comprises:

a first substrate 100 which is a transparent substrate capable of blocking water and oxygen, for example, an inorganic substrate such as a glass substrate, a quartz substrate, or the like;

an OLED 1 disposed on the surface of the first substrate 100;

a packaging layer 2 covering a surface of the OLED 1 away from the first substrate 100, wherein the packaging layer 2 comprises an organic layer 201 in contact with the OLED 1, a heat dissipation layer 200 and an inorganic layer 202 which are located at a side of the organic layer 201 away from the OLED 1. A first surface of the organic layer 201 away from the OLED 1 is uneven, the heat dissipation layer 200 is arranged to be in contact with the first surface of the organic layer 201, and a first surface of the heat dissipation layer 200 away from the OLED 1 is uneven.

This OLED packaging structure can significantly increase the effect of heat dissipation of the heat dissipation layer 200, and remarkably improve the bonding effect between the packaging layer 2 and the OLED 1.

An embodiment of the present disclosure further provides a display device comprising the OLED packaging structure as described above. The performance of the OLED in this display device is ensured, while the service life of the OLED is prolonged and the quality of the display device is improved.

Based on the same inventive concept, an embodiment of the present disclosure provides a method of manufacturing the OLED packaging structure as described above, which comprises steps of forming an OLED on the first substrate and forming a packaging layer covering the OLED, wherein the step of forming the packaging layer comprises a step of forming the heat dissipation layer.

The OLED packaging structure formed through said steps can realize heat dissipation for the OLED, thereby preventing the generation of excessively high temperature and the damage to the OLED caused thereby.

In another embodiment of the present disclosure, the step of forming the packaging layer further comprises:

steps of forming an organic layer and forming an inorganic layer, wherein the organic layer is arranged to be in contact with the OLED, and the inorganic layer and the heat dissipation layer are located at a side of the organic layer away from the OLED.

The organic layer is used to strengthen the bonding between the heat dissipation layer and the inorganic layer and the OLED, while the inorganic layer is used to prevent the permeation of water, oxygen, and the like in the environment into the OLED, thus increasing the service life of the OLED.

Since the organic layer and the inorganic layer have different materials as well as different refractive indexes, total internal reflection occurs at the interface therebetween, which reduces the effectiveness of transmission of light through the packaging layer. Furthermore, the light lost due to the total internal reflection is converted into heat to be dissipated through the heat dissipation layer, and thus the generation of excessively high temperature and the damage to the OLED caused thereby is prevented.

The material of the inorganic layer may be silicon nitride, silicon oxide or silicon oxy-nitride. The inorganic layer is formed by a plasma-chemical vapor deposition film-forming process. Taking silicon dioxide as the material of the inorganic layer for example, the plasma-chemical vapor deposition film-forming process is conducted under the following typical parameter conditions: reacting $SiH_4$ and $N_2O$ in the form of plasma at a temperature of 350 degrees Cesium using a plasma-chemical vapor deposition device to form a silicon dioxide thin film on the first substrate. The equation of the reaction is given by:

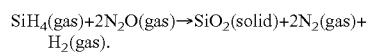

$$SiH_4(gas)+2N_2O(gas) \rightarrow SiO_2(solid)+2N_2(gas)+H_2(gas).$$

Optionally, the step of forming the heat dissipation layer comprises:

forming a first thin film; and forming an uneven structure on a surface of the first thin film away from the OLED so as to form the heat dissipation layer.

A first surface, away from the OLED, of the heat dissipation layer formed by the above-mentioned steps is uneven, and such a structure increases the surface area of the heat dissipation layer and thereby improves the effect of heat dissipation.

The heat dissipation layer may be made of graphene. To be specific, the first thin film can be formed by an inkjet printing, a chemical vapor deposition or a mechanical exfoliation process, and the uneven structure on the surface of the first thin film away from the OLED is formed by a photoetching process. The inkjet printing process is a process in which black graphene powder is dispersed in a solvent to form liquid ink, and then the liquid ink is jetted and printed onto the first substrate so as to form a thin film of graphene. The chemical vapor deposition process is a process in which hydrocarbon gas (methane, ethylene, acetylene, etc.) is adsorbed onto the surface of a metal (e.g., copper, nickel, silver, etc.) or other material having catalytic activity, and then the hydrocarbon gas is dehydrogenated when heated at a high temperature so as to form a thin film of graphene on the first substrate. The mechanical exfoliation process is a process in which a transparent adhesive tape is used to be stuck on a piece of graphite and then peeled off, and after repeating such operations several times, a side of the adhesive tape carrying graphene is brought into contact with the first substrate and repeatedly pressed, and the graphene is transferred and left on the first substrate after the tape is removed, i.e., a thin film of graphene is formed. The photoetching process is a process in which a photoresist is coated on the surface of the thin film of graphene and subjected to exposing and developing to obtain a photoresist having a desired pattern, and after a dry-etching process (gas used is a mixture of $SF_6$ and $O_2$ with a ratio by volume of $SF_6$ to $O_2$ being 3:4), the remaining photoresist is peeled off, so as to form an uneven structure on the surface of the thin film of graphene.

In order to improve the bonding effect between the heat dissipation layer and the inorganic layer and the OLED, the first surface of the organic layer away from the OLED is arranged to be uneven. The step of forming the organic layer comprises:

forming a second thin film; and forming the uneven structure on the surface of the second thin film away from the OLED so as to form the organic layer.

The organic layer may be made of polyacrylates, such as negative polyacrylates. The second thin film is formed by sputtering, evaporation or spin coating, and the uneven structure on the surface of the second thin film away from the OLED is formed by exposing and developing. When the organic layer is made of negative polyacrylates, the organic layer has a typical thickness of two micron. The exposing and developing is carried out under the following parameter conditions: a soft-bake process is conducted at a temperature of 100 degrees Celsius for about 60 seconds, and a developing solution is prepared from organic amines (such as TMAH) or inorganic salt (such as potassium hydroxide), and a typical developing solution is TMAH at a concentration of 2.38%.

Further, the heat dissipation layer is formed on the first surface of the organic layer away from the OLED so as to increase the surface area of the heat dissipation layer and improve the effect of heat dissipation.

In the embodiment of the present disclosure, the manufacturing method may further comprise:

forming a sealant layer covering the packaging layer. The sealant layer may be made of a heat-curable material or a UV-curable material and act to seal.

Figure 3:
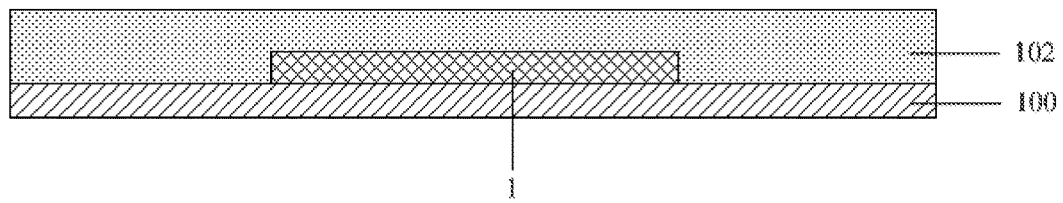
FIGS. 3-7 are schematic diagrams of the manufacturing procedure of an OLED packaging structure of an embodiment of the present disclosure.
Figure 4:
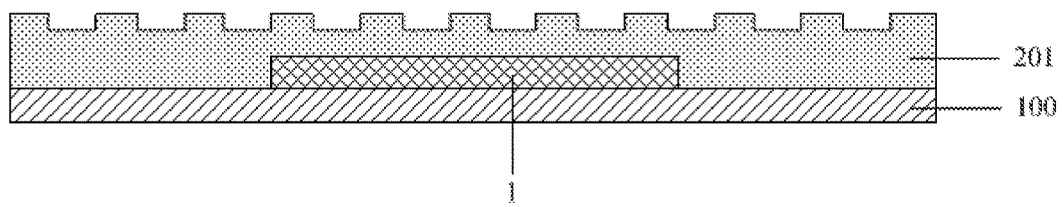
Figure 5:
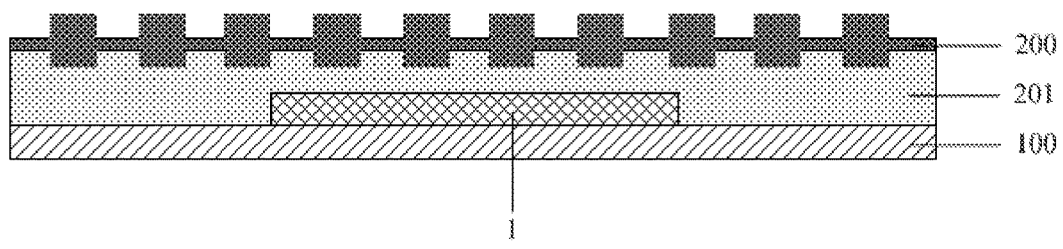
Figure 6:
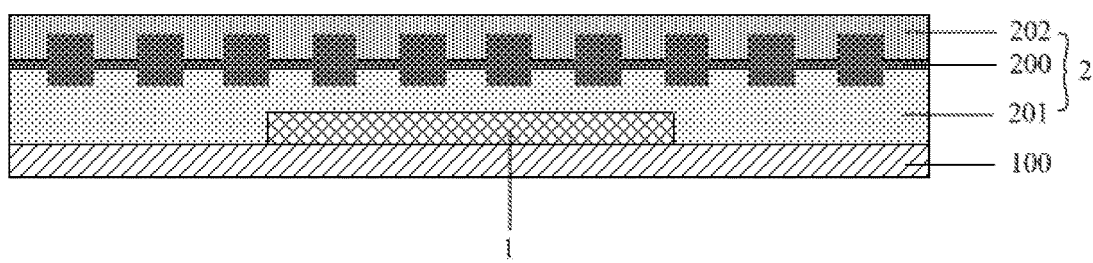

As shown in FIGS. 1, 3-6, in the embodiment of the present disclosure, the method of manufacturing the OLED packaging structure comprises:

Step S1: forming the OLED 1 on a first substrate 100 by a process which can be found in prior art and will not be detailed here, and then forming the second thin film 102 on the OLED 1 through a film-forming process such as sputtering, plasma enhanced chemical vapor deposition, evaporation or spin coating, as shown in FIG. 3;

Step S2: forming the uneven structure on a surface of the second thin film 102 away from the OLED 1 by exposing and developing so as to form the organic layer 201, as shown in FIG. 4;

Step S3: forming the first thin film (not shown in the figures) through a film-forming process such as an inkjet printing, a chemical vapor deposition or a mechanical exfoliation process, the first thin film being arranged to be in contact with the first surface of the organic layer 201 away from the OLED 1;

Step S4: forming the uneven structure on the first surface of the first thin film away from the OLED 1 by processes such as coating a photoresist, exposing, developing, etching, and exfoliation, so as to form a transparent heat dissipation layer 200, as shown in FIG. 5;

Step S5: forming the inorganic layer 202 through plasma enhanced chemical vapor deposition, the inorganic layer 202 being arranged to be in contact with the first surface of the heat dissipation layer 200 away from the OLED 1, as shown in FIG. 6.

To this step, the manufacturing of the packaging layer 2 is completed.

Figure 7:
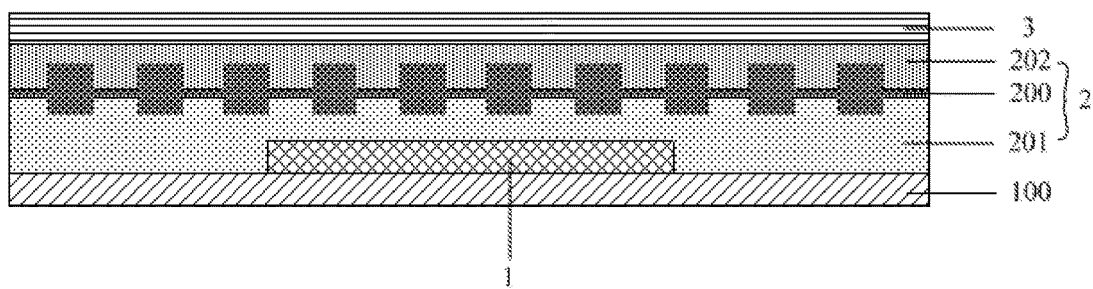

Step S6: forming a sealant layer 3 covering the packaging layer 2 by a spin coating process, as shown in FIG. 7, wherein the material of the sealant layer 3 is a heat-curable material or a UV-curable material;

Step S7: attaching a packaging coverplate 101 onto the sealant layer 3, as shown in FIG. 1.

To this step, the manufacturing of the OLED packaging structure is completed.

The above are optional embodiments of the present disclosure. It shall be indicated that several improvements and replacements may also be made by a person having ordinary skills in the art without departing from the technical principle of the present disclosure, and such improvements and replacements should also be deemed to be encompassed in the protection scope of the present disclosure.

What is claimed is:

1. An organic light-emitting diode (OLED) packaging structure, comprising a first substrate, an OLED disposed on the first substrate, a first packaging layer, and a second packaging layer, wherein each of the first and second packaging layers comprises a heat dissipation layer, the first packaging layer covers a first surface of the OLED, the second packaging layer covers an opposite second surface of the OLED, and the first surface of the OLED is further away from the first substrate than the second surface of the OLED, and each of the first and second packaging layers further comprises an organic layer in contact with the OLED, and an inorganic layer, the inorganic layer and the heat dissipation layer are located at a side of the organic layer away from the OLED.

2. The OLED packaging structure according to claim 1, wherein a first surface of the organic layer away from the OLED is uneven.

3. The OLED packaging structure according to claim 2, wherein the heat dissipation layers are in contact with the first surface of the organic layer.

4. The OLED packaging structure according to claim 1, further comprising two sealant layers covering the first and second packaging layers, respectively.

5. The OLED packaging structure according to claim 1, wherein the heat dissipation layers are each made of transparent graphene.

6. The OLED packaging structure according to claim 3, wherein the heat dissipation layers are made of transparent graphene.

7. A display device comprising the OLED packaging structure according to claim 1.

8. A method of manufacturing the OLED packaging structure according to claim 1, comprising steps of forming the OLED on the first substrate and forming a packaging layer covering the OLED, wherein the packaging layer is the first packaging layer or the second packaging layer, wherein the step of forming the packaging layer covering the OLED comprises a step of forming the heat dissipation layer.

9. The manufacturing method according to claim 8, wherein the step of forming the heat dissipation layer comprises:

forming a first thin film; and forming an uneven structure on a surface of the first thin film away from the OLED, so as to form the heat dissipation layer.

10. The manufacturing method according to claim 9, wherein the step of forming the packaging layer further comprises:

forming the organic layer in contact with the OLED and forming the inorganic layer.

11. The manufacturing method according to claim 10, wherein the step of forming the organic layer comprises:

forming a second thin film; and forming an uneven structure on a surface of the second thin film away from the OLED, so as to form the organic layer.

12. The manufacturing method according to claim 11, wherein the organic layer is made of polyacrylates.

13. The manufacturing method according to claim 11, wherein the second thin film of the organic layer is formed by sputtering, evaporation or spin coating.

14. The manufacturing method according to claim 11, wherein the heat dissipation layer is formed on a first surface of the organic layer away from the OLED.

15. The manufacturing method according to claim 9, wherein the heat dissipation layer is made of graphene.

16. The manufacturing method according to claim 9, wherein the first thin film of the heat dissipation layer is formed by an inkjet printing process, a chemical vapor deposition process or a mechanical exfoliation process.

17. The manufacturing method according to claim 8, further comprising:
forming a sealant layer covering the packaging layer.

18. The manufacturing method according to claim 17, wherein the sealant layer is made of a heat-curable material or a UV-curable material.

19. The OLED packaging structure according to claim 1, wherein the heat dissipation layers are each made entirely of a same material, and both a first surface of the heat dissipation layer located away from the OLED and a second opposite surface of the heat dissipation layer that faces the OLED are uneven.

* * * * *